United States Patent
Fischer

(10) Patent No.: US 6,307,419 B1
(45) Date of Patent: Oct. 23, 2001

(54) HIGH FREQUENCY BIPOLAR SWITCHING TRANSISTOR

(75) Inventor: Mark C. Fischer, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/755,757

(22) Filed: Jan. 5, 2001

Related U.S. Application Data

(60) Provisional application No. 60/184,976, filed on Feb. 25, 2000.

(51) Int. Cl.[7] ..................................................... H03K 17/04
(52) U.S. Cl. ........................................... 327/374; 327/484
(58) Field of Search ........................... 327/110, 374–377, 327/379, 438–444, 453, 447, 450, 478, 482–488, 465, 467

(56) References Cited

U.S. PATENT DOCUMENTS 5,410,190 * 4/1995 Carobolante .......................... 327/110
5,703,520 * 12/1997 Dikeman et al. ..................... 327/439

* cited by examiner

*Primary Examiner*—Toan Tran
(74) *Attorney, Agent, or Firm*—J. Dennis Moore; W. James Brady, III; Frederick J. Telecky, Jr.

(57) ABSTRACT

A high frequency bipolar switching transistor circuit. A first bipolar transistor is provided, having an emitter adapted to receive a voltage, having a base adapted to receive a drive current, and having a collector. A second bipolar transistor is provided, having a base connected to the collector of the first bipolar transistor, having a collector connected to the base of the first bipolar transistor, and having an emitter. An inductor having a first port connected to the common connection node of the collector of the first bipolar transistor and the base of the second transistor, and having a second port connected to the emitter of the second transistor. The common connection node of the emitter of the second transistor and the second port of the inductor form the output of the circuit.

3 Claims, 2 Drawing Sheets

HIGH FREQUENCY BIPOLAR SWITCHING TRANSISTOR

This application claims priority under 35 U.S.C. § 119 (e)(1) of provisional application Ser. No. 60/184,976 filed Feb. 25, 2000.

TECHNICAL FIELD OF THE INVENTION

This invention relates to semiconductor devices used for switching electrical currents, and more particularly relates to bipolar transistors used for high speed current switching.

BACKGROUND OF THE INVENTION

The utilization of bipolar junction transistors as switching elements in switching power supplies has been limited by their disposition to heat excessively at high switching frequencies. This, in turn, degrades their turn-off characteristics, which leads to additional heating. Recent development of high gain, high current bipolar transistors, such as the 788-769 and complementary 688-695 series bipolar transistors manufactured by Zetex plc, have led to switching regulator implementations at currents of two amperes with switching frequencies in excess of 100 KHz. Still, high currents and high voltages have restricted the choice of pass elements in switching regulators to MOSFETS. This is owing to the beta limitations of bipolar junction transistors at turn-on.

At turn-on, a switching element is compelled to commutate another switching device, typically a freewheeling diode, and reverse the voltage on an inductive element. This action is accompanied by extremely high instantaneous currents. As beta limitations in a bipolar junction transistor make it impossible to transit this state with any rapidity, the result is that the beta limit current is conducted by the transistor at full voltage while the circuit's capacitive elements are commutated. Each turn-on of the switch accumulates heat energy equal to the product of the input voltage, the beta current limit, and the time interval between the onset of switch drive and the actual voltage change at the inductor. Obviously, increasing the number of switch turn-ons per second has the effect of increasing the accumulated heat. The applicability of a device thus becomes limited by the ability to remove this accumulated heat or its ability to maintain its current gain at high currents and thus minimize its transit time through this region of high power dissipation.

MOSFETs overcome this problem by being specified to have an "on" resistance, which under conditions of constant current, would make them competitive with the Vcesat of a bipolar junction transistor ("BJT"). This necessarily makes them substantially larger than the competitive BJT. They are typically capable of ten times their rated continuous current in a pulse mode. They can, therefore, transit the high current region of tun-on extremely rapidly, but that is also their bane in switching applications, as their Miller effect capacitances are hundreds of times larger than those of BJTs. This makes them prone to gate oscillations which can punch through their gates, and renders the drive circuitry much more complex. Their increased size also enables them to reject heat more efficiently.

Therefore, there is a need for a solution to the problem of overheating of BJTs used as switching elements in power supplies at high frequencies. The present invention solves this problem.

SUMMARY OF THE INVENTION

In accordance with the present invention there is provided a high frequency bipolar switching transistor circuit. A first bipolar transistor is provided, having an emitter adapted to receive a voltage, having a base adapted to receive a drive current, and having a collector. A second bipolar transistor is provided, having a base connected to the collector of the first bipolar transistor, having a collector connected to the base of the first bipolar transistor, and having an emitter. An inductor having a first port connected to the common connection node of the collector of the first bipolar transistor and the base of the second transistor, and having a second port connected to the emitter of the second transistor. The common connection node of the emitter of the second transistor and the second port of the inductor form the output of the circuit.

These and other features of the invention will be apparent to those skilled in the art from the following detailed description of the invention, taken together with the accompanying drawings.

DETAILED DESCRIPTION OF THE PREFERRED EMBODIMENT

Figure 1:
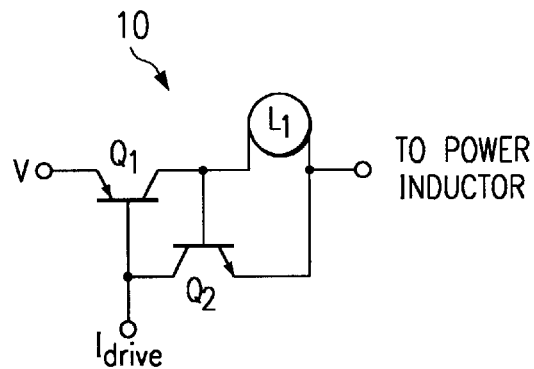
FIG. 1 is a circuit diagram of a first preferred embodiment of the present invention.

The preferred embodiment of the present invention provides a circuit that allows the use of bipolar transistors, such as high gain, high current BJTs, as switching elements in high frequency applications. FIG. 1 is a circuit diagram of this circuit 10. A PNP BJT Q1 has its emitter connected to a source DC voltage $V_s$. The base of PNP BJT Q1 is connected to the collector of an NPN BJT Q2, and receives a drive current $I_{drive}$. The collector of BJT Q1 and the base of BJT Q2 are connected together and to a first port of an inductor L1. The emitter of BJT Q2 is connected to a second port of inductor L1, which also serves as the output port of the circuit for connection to, for example, a power inductor. An exemplary transistor for Q1 may be a ZTX948, while an exemplary transistor for Q2 may be a ZTX869, both manufactured by Zetex plc. An exemplary value for L1, using such transistors, is 30 nH.

Transistor Q1 is driven in the same manner as in the prior art, i.e., by applying a drive current $I_{drive}$ sufficient to saturate it at its nominal conduction. At turn-on, transistor Q1 is being switched from non-conduction to full conduction, so initially the collector of transistor Q2, which operates as a kind of "helper" transistor, applies a voltage across the emitter to base junction of transistor Q1. This drives transistor Q1 on rapidly. The circuit 10 collapses regeneratively into its parasitic elements, resulting in extremely fast rise (or fall) times across inductor L1. The voltage across inductor L1 falls rapidly to zero thereby shorting the base-emitter junction of transistor Q2, turning it off. Thus, helper transistor Q2 operates only to provide the desired very rapid turn-on time for transistor Q1, and otherwise is effectively not part of the circuit 10.

Figure 2:
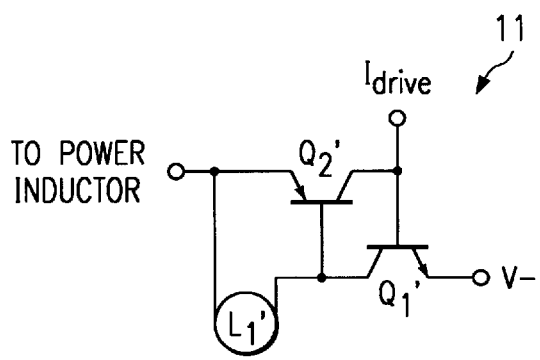
FIG. 2 is a circuit diagram of a second preferred embodiment of the present invention.

The circuit 10 may be implemented using an NPN BJT switching transistor, rather than the PNP BJT transistor Q1 of FIG. 10. Such a circuit 11 is shown in FIG. 2, wherein the switching transistor is NPN BJT transistor Q1', while the associated "helper" PNP transistor is BJT transistor Q2'. Inductor L1' is provided between the emitter of transistor Q2' and the common connection node of the base of transistor Q2' and the collector of transistor Q1'.

The operation of circuit 10, and of circuit 11, may be compared to that of a silicon controlled rectifier ("SCR") having its gate to cathode junction shunted by a small inductor. Viewing the circuit 11(FIG. 2 in this way, for a PNP switching transistor the circuit may be compared to a PNP(n) SCR, and, viewing the circuit 11 (FIG. 2) this way, for an NPN switching transistor the circuit may be compared to an NPN(p) SCR.

At turn-on, transistor Q1 is being switched from non-conduction to full conduction, so initially the collector of transistor Q1 applies a voltage across the gate to cathode junction of the SCR. This triggers the SCR "device" which collapses regeneratively into the parasitic elements of the circuit, resulting in the extremely fast rise (or fall) time across the power inductor. It also allows the circuit to switch rapidly at significantly lower currents than the current provided at maximum output, where prior art switching transistors exhibit beta drop-off that can dramatically slow switching, and even prevent it altogether. The voltage across the gate to cathode shunting inductor (L1) eventually establishes the average switch current in that inductor, which effectively shorts out the P(n) or (p)N junction, allowing the bipolar transistor Q1 to provide a voltage drop of only the amount of its collector-emitter saturation voltage, $V_{cesat}$.

Figure 3:
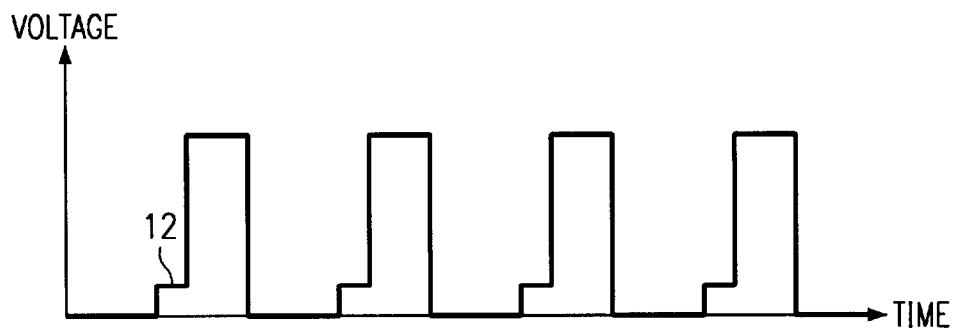
FIG. 3 is a signal diagram of power signals provided by prior art switching transistors.
Figure 4:
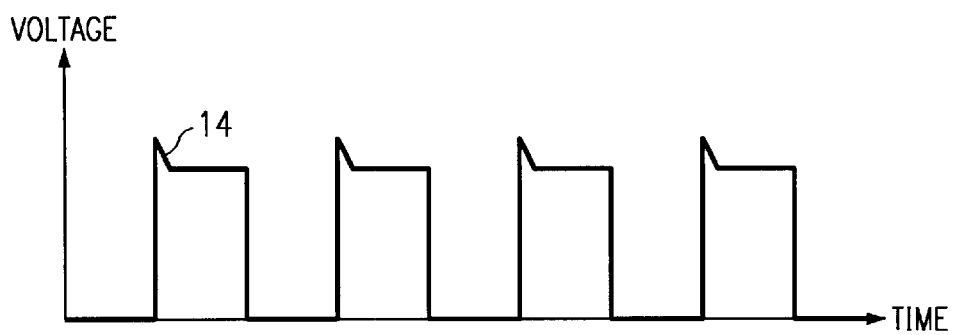
FIG. 4 is a signal diagram of power signals provided by the switching transistor circuit of FIG. 1.

To better understand the improvement provided by the preferred embodiment of the present invention, consider the operation of a BJT switching transistor (not shown) not having the benefit of the helper transistor described above. FIG. 3 is a signal diagram, in which the horizontal axis represents time while the vertical axis represents voltage, showing the output of such a transistor. The pulses applied to the base of the BJT give rise to an output voltage waveform that is likewise pulsed. However, note that the onset transition of each output pulse a lag interval 12 can be seen during which the rising output voltage is held low for a small interval of time, due to the beta limit effect mentioned above. It is during this interval that the aforementioned undesirable heating occurs. By contrast, the output voltage waveform of the circuit 10 of FIG. 1 exhibits the characteristics shown in the signal diagram of FIG. 4. Rather than a lag interval as in FIG. 3, the waveform exhibits a slight overshoot 14, which is acceptable in most applications, while overcoming the problem overheating effects of prior art configurations.

The circuit 10 of FIG. 1 may be constructed of discrete devices, and it may be constructed as an integrated circuit, although the inductor L1 may be provided as an external, discrete device in the latter case. As an integrated circuit the composite structure comprising transistors Q1 and Q2 may be fabricated as a four layer structure in the substrate.

Figure 5:
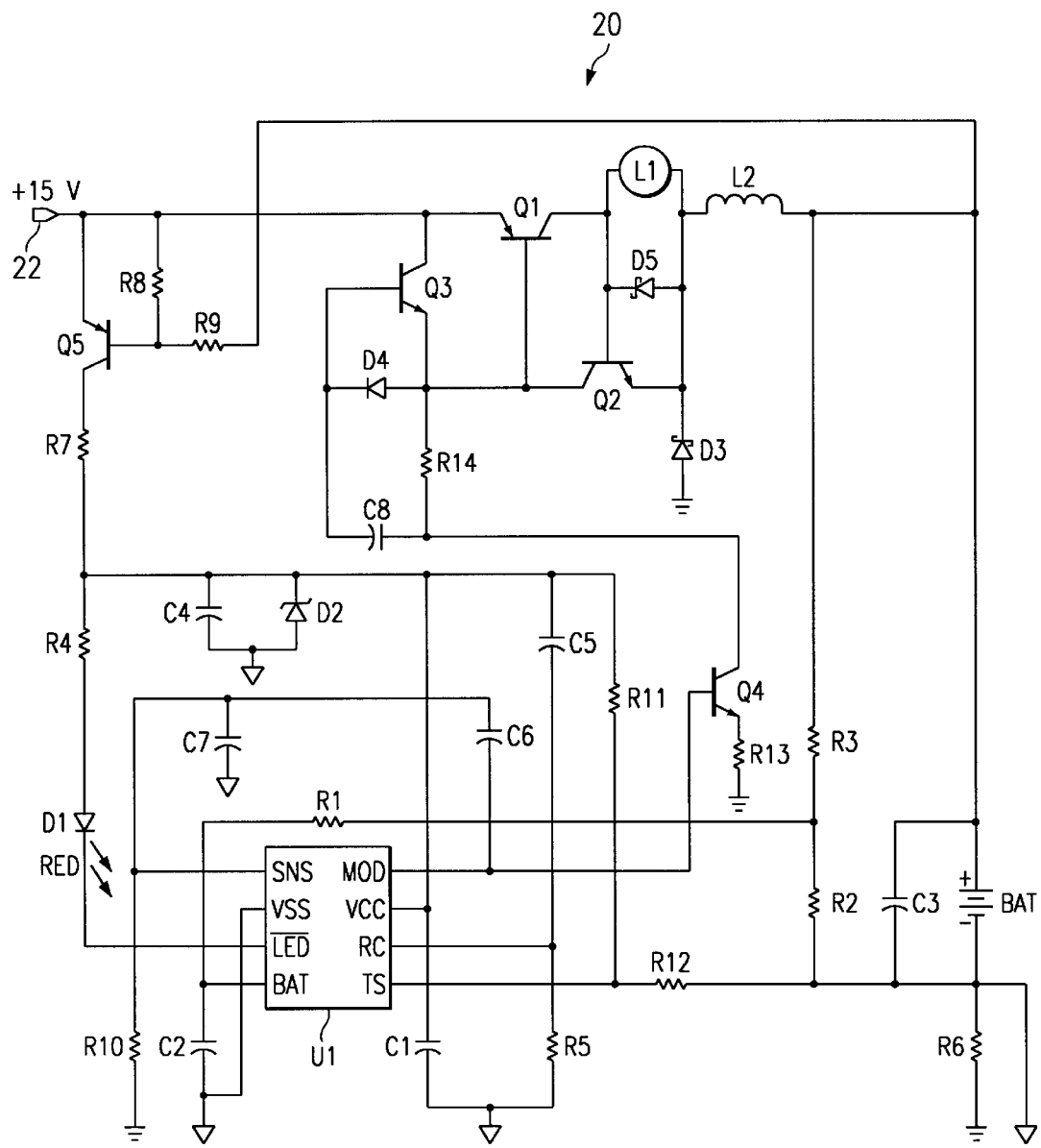
FIG. 5 is a circuit diagram of a second preferred embodiment of the present invention, in which a switching transistor circuit is applied in a battery charger.

The circuit of FIG. 1 may be applied in numerous applications where a pulsed power source is desired, for example in switching regulators. FIG. 5 is a circuit diagram showing a typical application of the circuit 10 shown in FIG. 1. The circuit 20 of FIG. 5 is a battery charger. The circuit 20 is based on a programmable, multi-chemistry, fast-charge management integrated circuit ("IC") U1, such as the BQ2000 manufactured by Texas Instruments Incorporated. The BQ2000 is used for fast-charge management of nickel cadmium (NiCd), nickel metal-hydride (NiMH), or lithium-ion (LI-Ion) batteries in single or multi-chemistry applications.

The circuit 20 is constructed as follows. A source DC voltage, in this case having a magnitude of +15 volts, is provided at an input node 22. The input node is connected to the emitter of a PNP transistor Q5, to one port of a resistor R8, to the emitter of a PNP transistor Q1, and to the collector of an NPN transistor Q3. The base of transistor Q5 is connected to the other port of resistor R8 and to one port of a resistor R9. The collector of transistor Q5 is connected to one port of a resistor R7. The other port of resistor R7 is connected to one port of a resistor R4, to one port of a capacitor C4, to the anode of a Zener diode D2, to one port of a capacitor C1, to one port of a capacitor C5, to one port of a resistor R11, and to the VCC pin of IC U1. The other port of resistor R4 is connected to the cathode of a light emitting diode ("LED") D1. The anode of LED D1 is connected to the $\overline{\text{LED}}$ pin of IC U1. The other port of capacitor C4, the anode of Zener diode D2, and the other port of capacitor C1, are all connected to an analog ground tied to the negative terminal of the battery to be charged, BAT. The other port of capacitor C5 is connected to one port of a resistor R5 and to the RC pin of IC U1. The other port of resistor R5 is connected to analog ground. The other port of resistor R11 is connected to one port of a resistor R12 and to the TS pin of IC U1. The other port of resistor R12 is connected to analog ground. The SNS pin of IC U1 is connected to one port of a resistor R10, the other port of which is connected to ground for the voltage reference provided at input node 22, denominated "power ground," to one port of a capacitor C7, the other port of which is connected to analog ground, and to one port of a capacitor C6. The other port of capacitor C6 is connected to the MOD pin of IC U1 and to the base of an NPN transistor Q4. One port of a capacitor C2 is connected to the BAT pin of IC U1 and to one port of a resistor R1. The other port of capacitor C2 is connected to analog ground, as is the VSS pin of IC U1. The other port of resistor R1 is connected to one port of a resistor R3 and to one port of a resistor R2. The other port of resistor R2 is connected to analog ground.

The emitter of transistor Q4 is connected to a resistor R13, the other port of which is connected to power ground. The collector of transistor Q4 is connected to one port of a resistor R14 and to one port of a capacitor C8. The other port of capacitor C8 is connected to the base of transistor Q3 and to the anode of PN junction diode D4. The other port of resistor R14 is connected to the cathode of diode D4, to the emitter of transistor Q3, to the base of transistor Q1 and to the collector of a transistor Q2. The base of transistor Q2 is connected to the collector of transistor Q1, to the cathode of a Schottky diode D5, and to one port of a small inductor L1. The other port of inductor L1 is connected to one port of a power inductor L2, to the anode of diode D5, to the emitter of transistor Q2 and to the cathode of a Schottky diode D3. The anode of diode D3 is connected to power ground. The other port of inductor L2 is connected to the other port of resistor R9, to the other port of resistor R3, to the positive terminal of battery BAT and to one port of a capacitor C3. The other port of capacitor C3 is connected to analog ground. Finally, a resistor R6 is connected between analog ground and power ground. Exemplary values for the foregoing components are as shown in Table 1, where K represents kilohms (kΩ).

TABLE 1

| Component | Value | Component | Value | Component | Value |
|---|---|---|---|---|---|
| R1 | 100KΩ | R10 | 1K | C5 | .047 µF |
| R2 | 75K | R11 | 30K | C6 | 4.7 pF |
| R3 | 300K | R12 | 20K | C7 | .0022 µF |
| R4 | 2K | R13 | 43Ω | C8 | 1000 pF |
| R5 | 11.8K | R14 | 43Ω | L1 | 30 nH |
| R6 | .01Ω | C1 | .1 µF | L2 | 1000 µH |
| R7 | 2K | C2 | .1 µF | | |
| R8 | 10K | C3 | 10 µF | | |
| R9 | 10K | C4 | 10 µF | | |

The circuit 20 is of the buck converter type, and operates as follows. In general, during battery charging the reference voltage provided on input node 22 is switched on and off by transistor Q1, under control of the pulse width modulation control output signal of the MOD pin of IC U1. This output turns transistor Q4 on and off, controlling the circuit comprised of transistor Q3, D4, R14 and C8 to turn the switching arrangement of transistors Q1 and Q2 on and off. The resultant pulse width modulated voltage is smoothed by integrating inductor L2 and then applied to the battery BAT, which is thus charged. Transistor Q1, transistor Q2, and inductor L1 operate as described above in connection with FIG. 1. In addition, the Schottky diode D5 is provided to prevent the inductor L1 from ringing and thereby turning on transistor Q2 when its ON state is being called on. Schottky diode D3 is a so-called freewheeling diode of the type typically used in buck converters, allowing current to conduct through inductor L2 as its field collapses when transistor Q1 is turned off.

Transistor Q5 provides a bias voltage through resistor R7 that has its magnitude set by Zener diode D2, and is applied to the supply voltage input VCC of IC U1. Capacitor C4 is located close to diode D2, and provides voltage smoothing for diode D2. Capacitor C1 provides voltage smoothing at pin VCC. Transistor Q5 is biased on by the voltage divider formed by resistors R8 and R9 across the supply voltage and the positive terminal of the battery BAT. A voltage is applied to the temperature-sense input of IC U1 at approximately mid-level of its range (no temperature sensor is used in this configuration—one could be added), set by the voltage divider formed by resistors R11 and R12. The LED D1 serves as a charging indicator, and receives bias current through resistor R4, activated by the $\overline{\text{LED}}$ pin of IC U1.

Resistor R6 senses the voltage difference between the power ground and the analog ground. This voltage difference is applied to the current-sense input, pin SNS, of IC U1 through resistor R10. Capacitor C6 is a small hysteresis capacitor providing positive feedback, smoothed by capacitor C7, to pin SNS, of IC U1 when pin MOD of IC U1 goes high. Resistor R5 and capacitor C5 form an RC timing circuit controlling the input to pin RC of IC U1. The RC time constant sets how long the battery BAT is allowed to charge, with the values listed above approximately twenty minutes.

As mentioned above, the filtered charging current is applied between the positive and negative terminals of battery BAT. Capacitor C3 provides additional smoothing to the voltage applied thereto. Resistors R2 and R3 form a voltage divider to establish a stepped-down voltage that is applied, through resistor R1 to the battery-voltage input pin BAT of IC U1. Capacitor C2 provides smoothing to this voltage.

Further details of the operation and construction of IC U1 can be found in specification sheets for the BQ2000 Programmable Multi-Chemistry Fast-Charge Management IC," which may be obtained from Texas Instruments Incorporated.

Thus, it can be seen from the above description that an improved circuit is provided in the present invention that imparts a switching gain to composite circuit including a high frequency Bipolar switching transistor. This circuit takes advantage of the regenerative current gain of a four-layer device, while providing a low impedance path for current flow to take advantage of the low $V_{cesat}$ during continuous conduction. By permitting a power bipolar transistor to transit the high current region of turn-on more rapidly, the application of power bipolar transistors can be extended to higher frequencies, making them competitive with MOSFETs and lowering the cost of building switching circuits, such as the one described hereinabove.

Although the present invention and its advantages have been described in detail, it should be understood that various changes, substitutions and alterations can be made herein without departing from the spirit and scope of the invention as defined by the appended claims.

What is claimed is:

1. A high frequency bipolar switching transistor circuit, comprising:

a first bipolar transistor having an emitter adapted to receive a voltage, having a base adapted to receive a drive current, and having a collector;

a second bipolar transistor having a base connected to the collector of said first bipolar transistor, having a collector connected to the base of said first bipolar transistor, and having an emitter; and an inductor having a first port connected to the common connection node of the collector of said first bipolar transistor and the base of said second transistor, and having a second port connected to the emitter of said second transistor;

the common connection node of the emitter of said second transistor and the second port of said inductor being the output of said circuit.

2. A high frequency bipolar switching transistor circuit, comprising:

a first bipolar transistor having an emitter adapted to receive a voltage, having a base adapted to receive a pulsed drive current for turning said first bipolar transistor on and off in accordance with said drive current pulses, and having a collector;

a second bipolar transistor having a base connected to the collector of said first bipolar transistor, having a collector connected to the base of said first bipolar transistor, and having an emitter; and an inductor having a first port connected to the common connection node of the collector of said first bipolar transistor and the base of said second transistor, and having a second port connected to the emitter of said second transistor;

the common connection node of the emitter of said second transistor and the second port of said inductor being adapted to provide a pulsed power output.

3. A battery charger, comprising:

an input port adapted to receive a voltage source;

a positive connection port and a negative connection port adapted for connection to the respective positive and negative terminals of a battery to be charged;

a first circuit connected to said positive and negative connection ports adapted to provide a sensed voltage corresponding to the voltage across said connection ports;

a second circuit adapted to receive said sensed voltage and to provide a pulsed control signal varying in accordance with said sensed voltage;

a high frequency bipolar switching transistor circuit, comprising
  a first bipolar transistor having an emitter adapted to receive said voltage source, having a base adapted to receive said pulsed control signal, and having a collector;
  a second bipolar transistor having a base connected to the collector of said first bipolar transistor, having a collector connected to the base of said first bipolar transistor, and having an emitter; and
  an inductor having a first port connected to the common connection node of the collector of said first bipolar transistor and the base of said second transistor, and having a second port connected to the emitter of said second transistor;
  the common connection node of the emitter of said second transistor and the second port of said inductor being the output of said circuit, providing a source of charging power for a battery.

* * * * *